United States Patent [19]
Kokubo

[11] Patent Number: 6,127,888
[45] Date of Patent: Oct. 3, 2000

[54] POWER AMPLIFICATION DEVICE

[75] Inventor: Kenichi Kokubo, Ota, Japan

[73] Assignee: Sanyo Electric Co., Ltd., Osaka, Japan

[21] Appl. No.: 09/182,769

[22] Filed: Oct. 29, 1998

[30]     Foreign Application Priority Data

Oct. 31, 1997  [JP]  Japan .................................. 9-300564

[51] Int. Cl.⁷ ............................... H03F 3/00; H03F 3/26; H03F 21/00
[52] U.S. Cl. ........................... 330/146; 330/270; 381/121
[58] Field of Search .................. 330/146, 270, 330/255; 381/120, 121

[56]           References Cited

U.S. PATENT DOCUMENTS

| 5,424,683 | 6/1995 | Takahashi | 330/259 |
| 5,488,331 | 1/1996 | Keane et al. | 330/296 |
| 5,920,229 | 7/1999 | Kokubo | 330/51 |

FOREIGN PATENT DOCUMENTS 6-338738  12/1994  Japan .

*Primary Examiner*—Robert Pascal
*Assistant Examiner*—Patricia T. Nguyen
*Attorney, Agent, or Firm*—Cantor Colburn LLP

[57]           ABSTRACT

There is disclosed a power amplification device for BTL-driving a load with a half-wave signal whose output direct current level is set close to an earth level, in which output signals of first and second output amplifiers (2) and (3) are added in an adder circuit (10). A higher output signal is selected from the two output signals and generated as an output signal c. Output currents of variable current sources (8) and (9) of the first and second output amplifiers (2) and (3) are controlled in response to the output signal c to change operating currents of the first and second output amplifiers (2) and (3). The operating currents are enlarged only when the output signals of the first and second output amplifiers (2) and (3) are enlarged. Thereby, the efficiency of the operating current of BTL drive type output amplifier is enhanced.

7 Claims, 5 Drawing Sheets

POWER AMPLIFICATION DEVICE

BACKGROUND OF THE INVENTION (i) Field of the Invention

The present invention relates to a power amplification device which is applied to reduce the operating current of an output amplifier.

(ii) Description of the Related Art

As an example of the conventional art in which the efficiency of an amplifier is raised by setting the midpoint voltage of the amplifier very close to an earth level, instead of setting it to half of the supply voltage, a power amplification device is described in Japanese Patent Application Laid-open No. 338738/1994. Such a power amplification device is constituted as shown in FIG. 5.

In FIG. 5, an input signal is applied to a negative input terminal of a first differential amplifier 1, and output signals reversed in phase with respect to each other are generated from positive and negative output terminals of the first differential amplifier 1. The positive and negative output signals of the first differential amplifier 1 are amplified by first and second output amplifiers 2 and 3. The first and second output amplifiers 2 and 3 form BTL amplifiers, and a load RL is BTL driven by output signals of the first and second output amplifiers 2 and 3.

Moreover, the output signals of the first and second output amplifiers 2 and 3 are non-linearly added by a non-linear adder circuit 4. The non-linear adder circuit 4 operates as an adder circuit when output signal levels of the first and second output amplifiers 2 and 3 are less than predetermined levels, while it operates as a clamp circuit when the output signal levels are more than the predetermined levels. An output signal of the non-linear adder circuit 4 is applied to a negative input terminal of a second differential amplifier 5. An output signal corresponding to a difference of positive input terminal from reference voltage Vr is applied to a common terminal C of the first differential amplifier 1. The common terminal C determines output direct current voltages of the first and second output amplifiers 2 and 3, and the output direct current voltages are controlled in response to the output signals of the first and second output amplifiers 2 and 3. Thereby, the output direct current voltages of the first and second output amplifiers 2 and 3 are set to voltages close to earth levels. Output signals a and b of the first and second output amplifiers 2 and 3 form half-wave output signals as shown in FIGS. 3A and 3B.

Furthermore, the output signals a and b of the first and second output amplifiers 2 and 3 are added by an adder circuit 6. An output signal c of adder circuit 6 is applied to a switching power supply 7. By performing switching in accordance with the level of the output signal of the adder circuit 6, a supply voltage Vx is generated following the output signals of the first and second output amplifiers 2 and 3. Specifically, as shown in FIG. 3C, the supply voltage Vx from the switching power supply 7 is analogous to the output signals a and b of the first and second output amplifiers 2 and 3. Subsequently, the supply voltage Vx is applied to the first and second output amplifiers.

In the power amplification device of FIG. 5, since the supply voltage Vx is changed in accordance with changes in output levels of the first and second output amplifiers 2 and 3, power saving can be realized. However, since the first and second output amplifiers 2 and 3 use constant currents from constant-current sources as operating currents, it is difficult to save much power even by changing the supply voltage Vx.

SUMMARY OF THE INVENTION

Therefore, an object of the present invention is to control the operating current of an output amplifier in accordance with the output level of the output amplifier. Specifically, as the output level of the output amplifier increases, the operating current is increased, while as the output level decreases, the operating current is decreased. Therefore, a sufficient amplification capacity can be obtained. Furthermore, when unnecessary, the operating current is reduced to raise the efficiency of current consumption. Moreover, if the supply voltage of the output amplifier is controlled in accordance with the output level of the output amplifier, the efficiency of power consumption can further be raised.

DETAILED DESCRIPTION OF THE PREFERRED EMBODIMENTS

Figure 1:
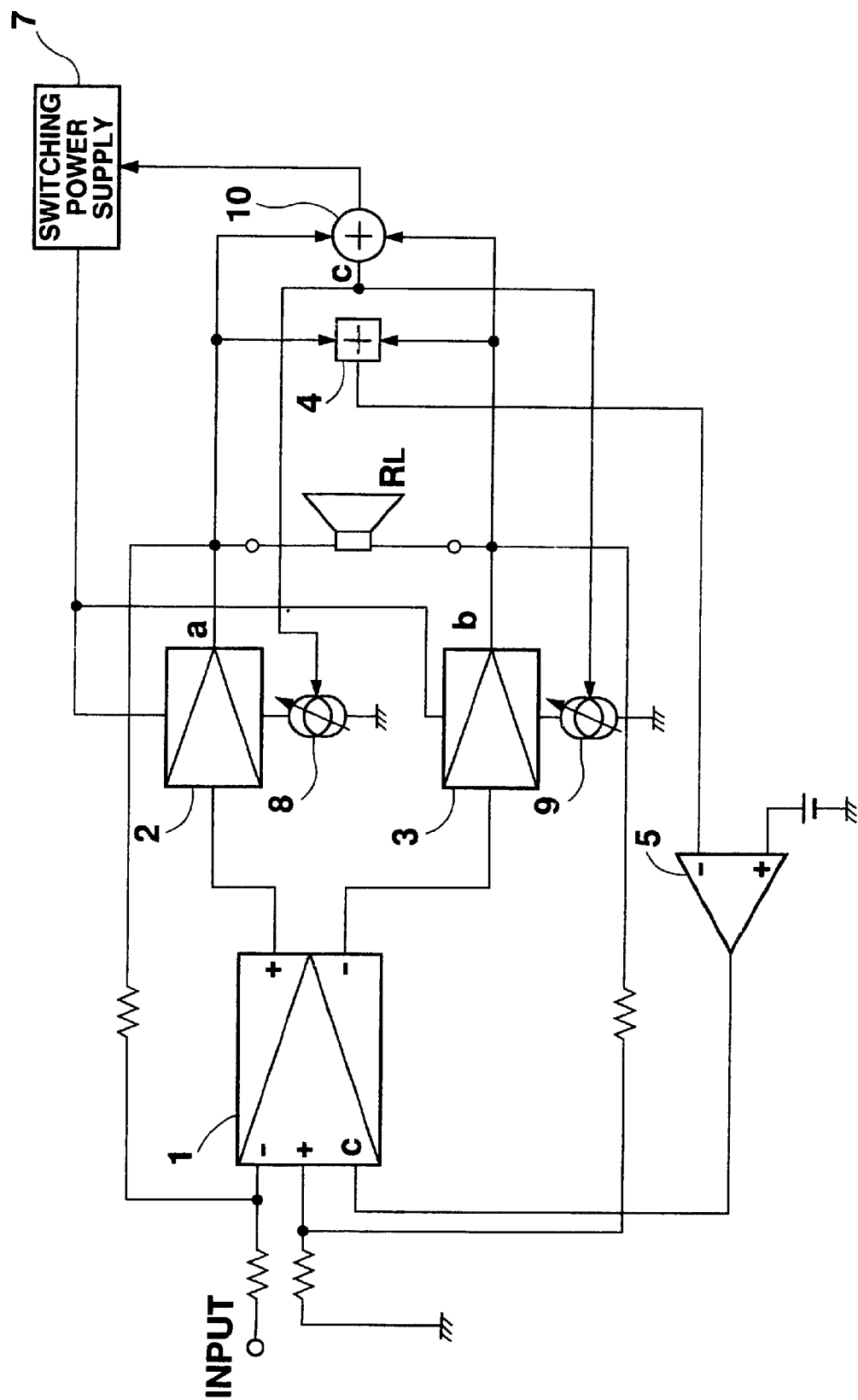
FIG. 1 is a block diagram showing an embodiment of the present invention.
Figure 5:
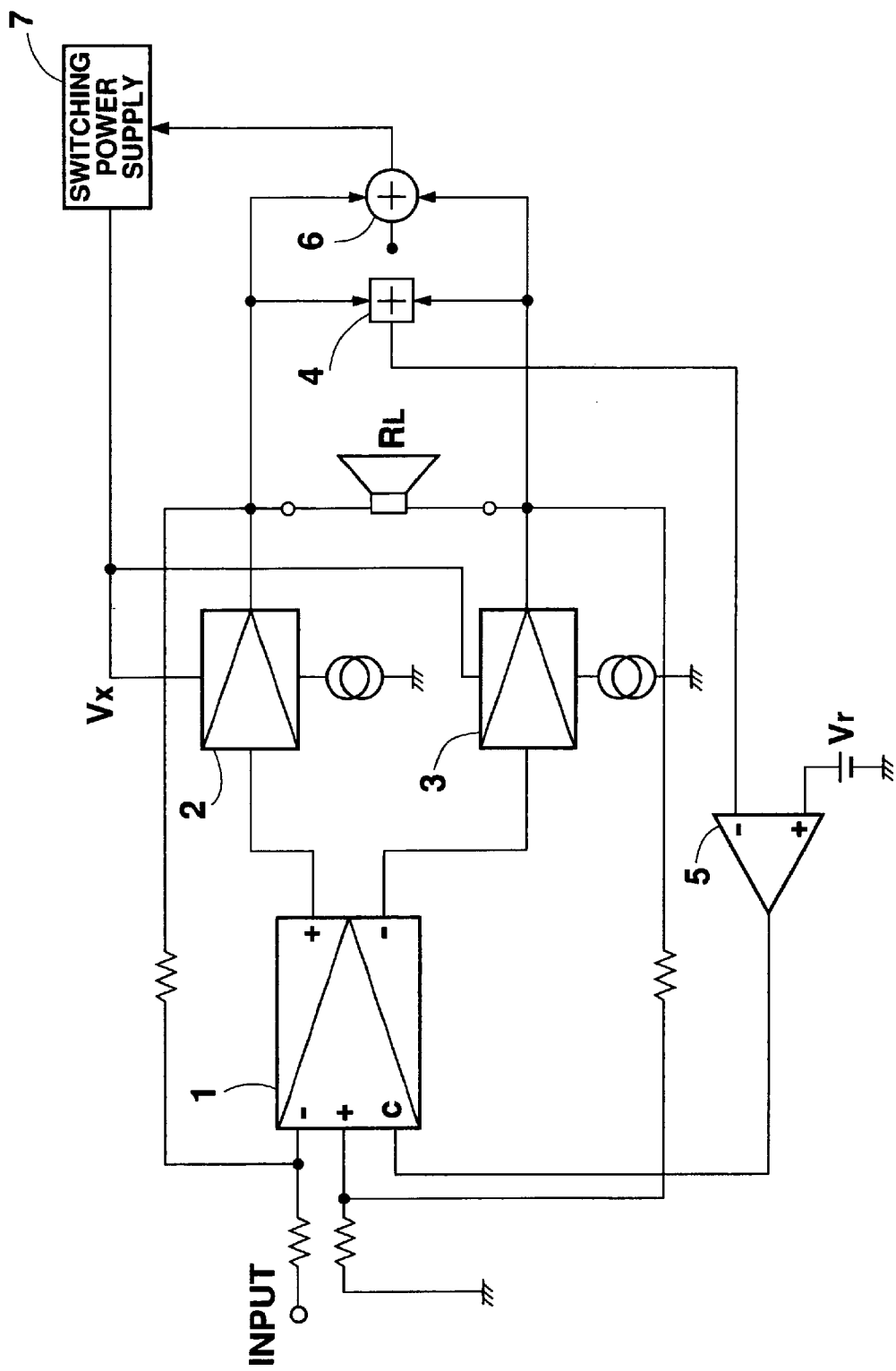
FIG. 5 is a block diagram showing a prior art.

FIG. 1 shows an embodiment of the present invention. Variable current sources 8 and 9 are provided for generating variable operating currents of first and second output amplifiers 2 and 3. An adder circuit 10 adds the output signals of the first and second output amplifiers 2 and 3, and generates a control signal for controlling the switching of switching power supply 7 and current control signals for controlling the variable current sources 8 and 9 to generate the operating currents of the first and second output amplifiers 2 and 3. Additionally, in FIG. 1, the same elements as those of the prior art in FIG. 5 are denoted with the same reference characters.

First, the amplifying operation of the power amplification device of FIG. 1 is the same as that of the prior art, and the description thereof is omitted.

Figure 3:
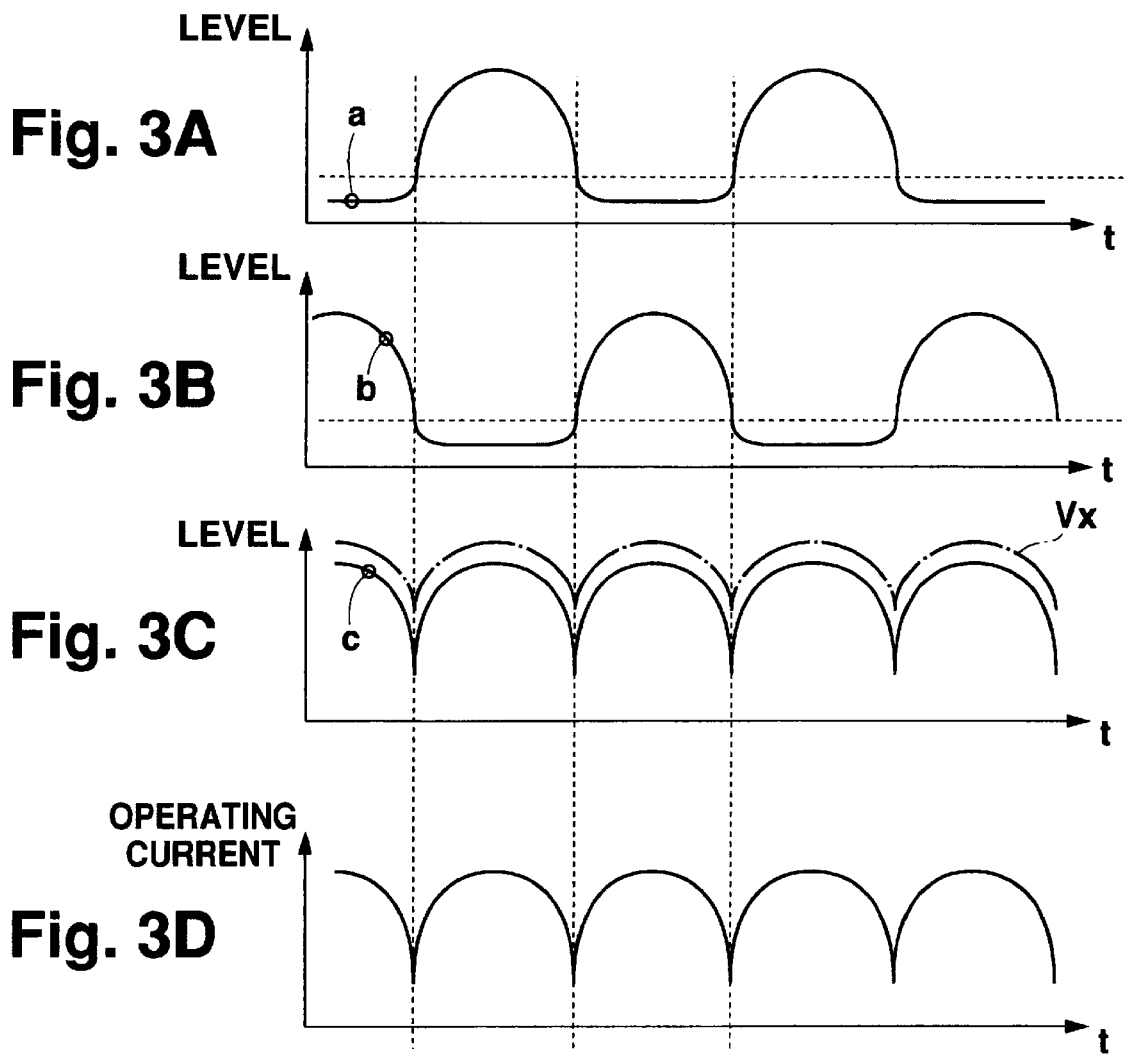
FIGS. 3A, 3B, 3C and 3D are waveform diagrams showing the operation of the present invention.

In FIG. 1, the adder circuit 10 adds the output signals of the first and second output amplifiers 2 and 3. Especially, the adder circuit 10 selects a signal with a higher output level from the output signals of the first and second output amplifiers 2 and 3, and generates one of the output signals a and b as output signal c. Therefore, as shown in FIG. 3C, the level of the output signal c from the adder circuit 10 changes in accordance with one of the output signals of the first and second output amplifiers 2 and 3.

The output signal c of the adder circuit 10 is applied to the variable current sources 8 and 9, and the operating currents generated from the variable current sources 8 and 9 change in size in accordance with the output signal c. The variable current sources 8 and 9 generate minimum necessary idling currents in such a manner that the first and second output amplifiers 2 and 3 keep minimum operating states at the time of no input signal. In this case, as shown in FIG. 3D, output currents of variable current sources 8 and 9 are enlarged when the output signal c is large, and reduced when the output signal c is small. When the output levels of the first and second output amplifiers 2 and 3 change as shown in FIGS. 3A and 3B, the operating currents of the first and second output amplifiers 2 and 3 change in accordance with changes in the output signal a and b as shown in FIG. 3D.

In the above-mentioned operation, when the input signal level is high and the high-level amplified output is generated, the operating currents of the first and second output amplifiers 2 and 3 can be enlarged. Input signals can be sufficiently amplified. Moreover, when the input signal level is low and a large amplification capacity is unnecessary, the operating currents can be lowered to prevent the supply of unnecessary operating currents. Therefore, by changing the operating currents of the first and second output amplifiers 2 and 3 in accordance with the output signals a and b, the efficiency of the operating currents can be enhanced.

Additionally, when the output signal c of the adder circuit 10 is applied to the switching power supply 7, the switching power supply 7 is switched in response to the output signal c. Accordingly, the supply voltage Vx generated from the switching power supply 7 is generated in a waveform as shown in FIG. 3C. Therefore, as shown in FIG. 3C, the supply voltage Vx changes in accordance with the level change of the output signal from one of the first and second output amplifiers 2 and 3. Specifically, when the output signals of the first and second output amplifiers 2 and 3 have high levels, the supply voltage Vx is raised. When the output signals a and b are lowered, the supply voltage Vx is also lowered.

In general, power consumption is determined by the product of the supply voltage Vx and the current, i.e. the operating current flowing through the first and second output amplifiers 2 and 3. In the circuit of FIG. 1, when the output levels of the first and second output amplifiers 2 and 3 are high, both the operating current and the supply voltage Vx are raised to increase the power consumption. On the other hand, when the output levels are low, both the operating current and the supply voltage Vx are lowered to decrease the power consumption. Therefore, by combining controls of the operating current and the supply voltage Vx, the power consumption can further be controlled.

Figure 2:
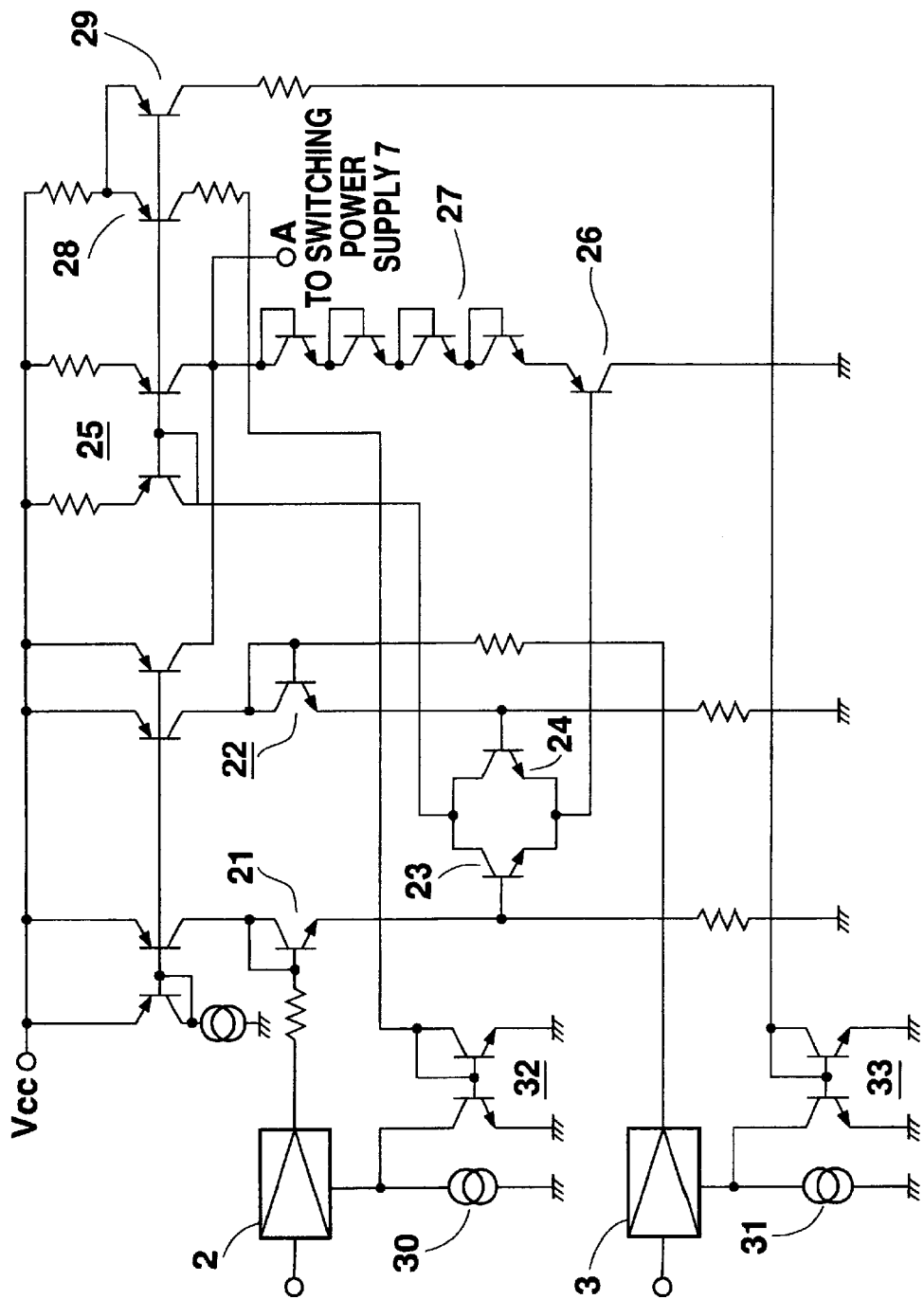
FIG. 2 is a circuit diagram showing a concrete example of an adder circuit 10.

FIG. 2 is a circuit diagram showing a concrete example of the adder circuit 10. There are provided a transistor 21 to which the output signal a of the first output amplifier 2 is applied; a transistor 22 to which the output signal b of the second output amplifier 3 is applied; transistors 23 and 24 whose bases are connected to emitters of transistors 21 and 22 and to which an emitter and a collector are connected in common; a current mirror circuit 25 for reversing collector currents of transistors 23 and 24; a transistor 26 whose base is connected to the emitters of transistors 21 and 22; a plurality of diode type transistors 27 connected between the current mirror circuit 25 and the emitter of the transistor 26; transistors 28 and 29 mirror-connected to the current mirror circuit 25; constant-current sources 30 and 31 for generating the idling currents of the first and second output amplifiers 2 and 3, respectively; and current mirror circuits 32 and 33 for reversing the collector currents of the transistors 28 and 29 to supply them to the first and second output amplifiers 2 and 3.

In FIG. 2, for the transistors 21 and 22, for example, when the transistor 21 is turned on by the output signal a of the first output amplifier 2, the base voltage of the transistor 21 corresponding to the output signal a is lowered by voltage Vbe between base and emitter of the transistors 21 and 23. A voltage (output signal a-2·Vbe) is generated on the emitter common to the transistors 23 and 24. Since the transistor 26 and a plurality of diode type transistors 27 are turned on, the emitter voltage of the transistor 23 is further raised by five times the voltage Vbe between base and emitter of the transistors 26 and 27. Therefore, the output signal c generated by shifting the level of the output signal a of the first output amplifier 2 is generated from output terminal A, and applied to the switching power supply 7.

Moreover, the emitter voltage of the transistor 21 is raised by the turning on of the transistor 21, and the transistor 23 is turned on. The collector current of the transistor 23 is reversed by the current mirror circuit 25. Since the transistors 28 and 29 are mirror-connected to the current mirror circuit 25, the output currents of the transistors 28 and 29 are also obtained by reversing the collector current of the transistor 23. Furthermore, the collector currents of transistors 28 and 29 are reversed by the current mirror circuits 32 and 33, respectively. After being added to the idling currents of the constant-current sources 30 and 31, the output currents of the current mirror circuits 32 and 33 flow through the first and second output amplifiers 2 and 3. Therefore, with the enlargement of the output signal of the first output amplifier 2, the operating currents of the first and second output amplifiers 2 and 3 are increased.

On the other hand, when the output signal b of the second output amplifier 3 is enlarged and the transistor 22 is turned on, the voltage is lowered by Vbe of transistors 22 and 24, and then raised by Vbe of transistors 26 and 27. Therefore, the output voltage c corresponding to the output signal b is generated from output terminal A. Moreover, when the turning on of the transistor 22 further brings about the turning on of the transistor 23, the collector current of the transistor 24 is reversed by the current mirror circuit 25 and the transistors 28 and 29 mirror-connected to the circuit, and further reversed by the current mirror circuits 32 and 33. Therefore, the operating currents of the first and second output amplifiers 2 and 3 are enlarged.

Additionally, when the output signals of the first and second output amplifiers 2 and 3 are low, the collector currents of the transistors 28 and 29 are also small. Therefore, the output currents of the constant-current sources 30 and 31 are preferably set as small as possible for the time of no input. Thereby, the power consumption can be reduced.

Figure 4:
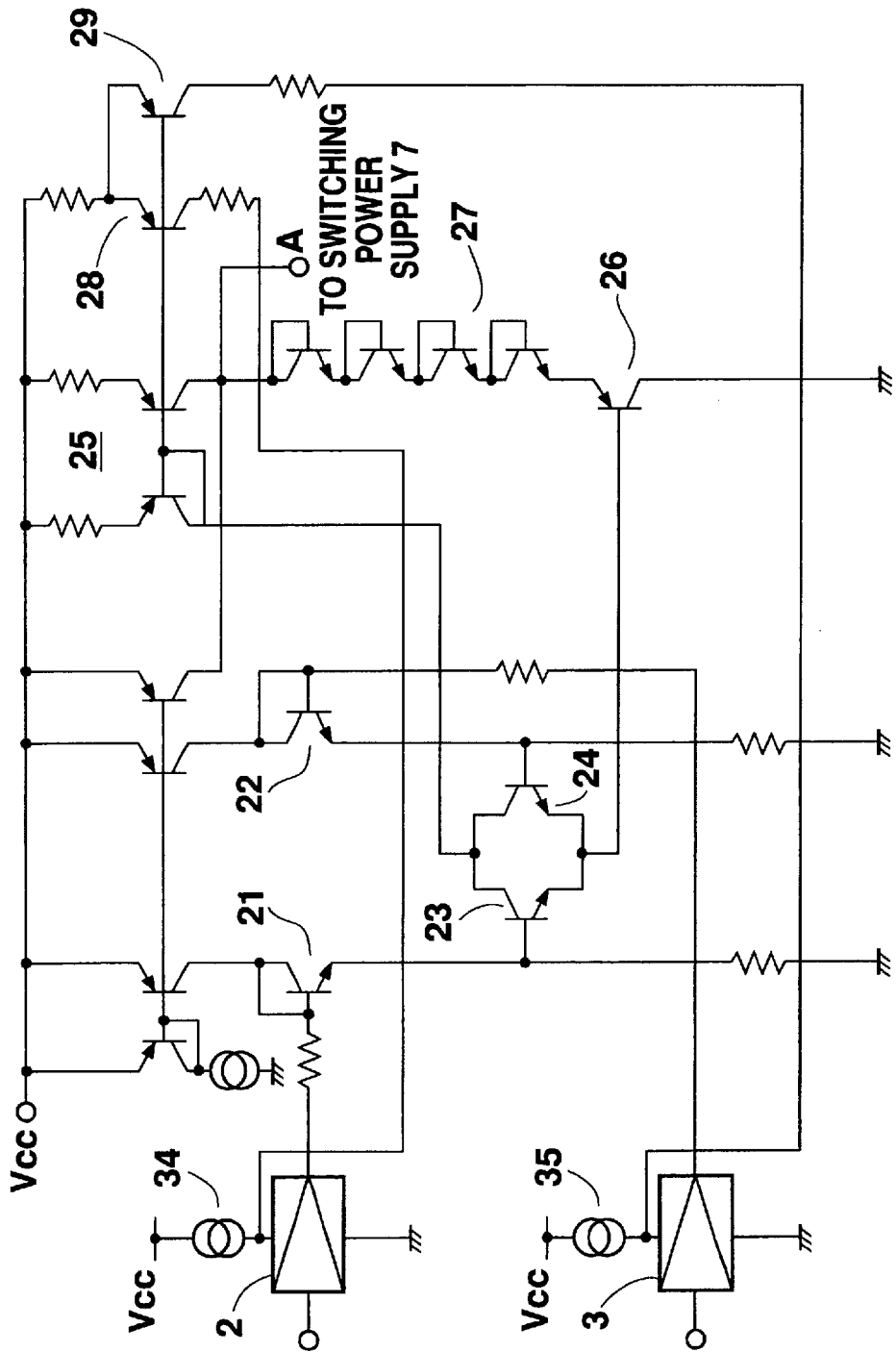
FIG. 4 is a circuit diagram showing another concrete example of the adder circuit 10.

FIG. 4 shows another example of the adder circuit 10. Constant-current sources 34 and 35 are provided which supply constant operating currents to the output amplifiers 2 and 3 from the side of supply voltage Vcc. The current obtained by adding the output currents of the constant-current sources 34 and 35 and the collector currents of the transistors 28 and 29 are supplied to the first and second output amplifiers 2 and 3. When the output signals of the first and second output amplifiers 2 and 3 are enlarged, the collector currents of the transistors 28 and 29 are also enlarged. Therefore, the operating currents of the first and second output amplifiers 2 and 3 are increased. The first and second output amplifiers 2 and 3 can be sufficiently operated. On the other hand, when the output signals of the first and second output amplifiers 2 and 3 are small, the operating currents are lowered, so that the power consumption can be reduced. Additionally, in the same manner as in FIG. 2, when the output signals of the first and second output amplifiers 2 and 3 are low, the collector currents of the transistors 28 and 29 are also small. Therefore, the output currents of the constant-current sources 34 and 35 are preferably set as small as possible for the time of no input.

What is claimed is:

1. A power amplification device comprising:

first and second output amplifiers for generating first and second output signals to a BTL-driven load;

a non-linear adder circuit for non-linearly adding the output signals of said first and second output amplifiers;

a non-linear amplifier amplifying an input signal, having an output voltage subjected to control in response to an output signal of said non-linear adder circuit, and generating input signals of said first and second output amplifiers; and an adder circuit for adding the output signals of said first and second output amplifiers, wherein operating currents of said first and second output amplifiers is controlled in response to an output signal of said adder circuit.

2. The power amplification device according to claim 1 wherein said adder circuit includes a voltage-current conversion circuit, and the operating currents of said first and second output amplifiers are directly controlled by an output current of the voltage-current conversion circuit.

3. The power amplification device according to claim 1 wherein said operating currents are enlarged when output levels of said first and second output amplifiers are raised, and reduced when said output levels are lowered.

4. The power amplification device according to claim 1, further comprising a switching power supply for generating supply voltages of said first and second output amplifiers in response to an output signal of said adder circuit.

5. The power amplification device according to claim 1, further comprising:

a pair of constant-current sources for passing the operating currents of said first and second output amplifiers; and a pair of current mirror circuits arranged in parallel with the pair of constant-current sources for passing a current corresponding to an output signal of said adder circuit.

6. The power amplification device according to claim 5 wherein when output levels of said first and second output amplifiers are raised, output currents of the current mirror circuits are increased and the operating currents are enlarged, and when said output levels are lowered, the output currents of the current mirror circuits are decreased and the operating currents are lowered.

7. The power amplification device according to claim 1 wherein the output signal of said adder circuit is supplied as it is as the operating currents of said first and second output amplifiers.

* * * * *